(12) United States Patent
Iguchi (10) Patent No.: US 6,396,708 B1
(45) Date of Patent: May 28, 2002

(54) CIRCUIT BOARD FRAME AND METHOD OF USE THEREOF FOR MANUFACTURING SEMICONDUCTOR DEVICE

(75) Inventor: Akihisa Iguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/499,469

(22) Filed: Feb. 7, 2000

(30) Foreign Application Priority Data

Feb. 8, 1999 (JP) .............................. 11-029482

(51) Int. Cl.[7] ................................ H05K 7/02
(52) U.S. Cl. ............... 361/760; 361/783; 361/767; 361/810; 174/260; 438/107; 438/110; 438/111; 438/113; 438/124; 257/668; 257/678; 257/701; 257/787
(58) Field of Search ................... 361/760, 783, 361/810, 767; 438/107, 110, 111, 113, 124, 1, 127; 257/668, 678, 701, 787; 174/260

(56) References Cited

U.S. PATENT DOCUMENTS

| | | | | |
|---|---|---|---|---|
| 5,731,231 A | * | 3/1998 | Miyajima | 438/124 |
| 5,773,895 A | * | 6/1998 | Hassan et al. | 257/774 |
| 5,986,695 A | * | 11/1999 | Freyman et al. | 438/112 |
| 6,114,189 A | * | 9/2000 | Chia et al. | 438/112 |
| 6,242,287 B1 | * | 6/2001 | Aoki et al. | 438/111 |

* cited by examiner

*Primary Examiner*—David Martin
*Assistant Examiner*—Thanh S. Phan
(74) *Attorney, Agent, or Firm*—Junichi Mimura (57) ABSTRACT

A push-back circuit board frame on which a semiconductor device is mounted, including a circuit board, the board being detached from the frame and being returned to an original position in the frame, a cavity formed at an edge of the circuit board in the frame, a semiconductor chip mounted on the circuit board, a resin sealing the semiconductor chip on the circuit board, and a support base made of the same material as the resin, formed in the cavity, where all of the resin is formed simultaneously, and connected each other.

26 Claims, 6 Drawing Sheets

CIRCUIT BOARD FRAME AND METHOD OF USE THEREOF FOR MANUFACTURING SEMICONDUCTOR DEVICE

CROSS-REFERENCE TO RELATED APPLICATION

This application claims the priority benefit of Japanese Patent Application No. 11-029482, filed Feb. 8, 1999, the entire subject matter of which is incorporated herein of reference.

BACKGROUND OF THE INVENTION

1. Field of the Invention

The invention relates to a circuit board frame and a method for manufacturing a semiconductor device using it and more particularly, to a circuit board frame which is formed by a push-back technology.

2. Description of the Related Art

Currently, based on requirements of high integration, a circuit board frame which is formed by push-back technology (called as push-back circuit board frame, hereinafter) is used to manufacture a semiconductor device. A push-back circuit board frame is formed by the following process. First, a circuit board is punched out completely from the circuit board frame. Then, the circuit board is returned to the original location. Therefore, the circuit board is supported by the frame with a frictional force only.

To manufacture a semiconductor device, a semiconductor chip is mounted on the circuit board which is pushed back by the method described above, and then, the semiconductor chip are connected to the circuit board by bonding wires. Then, the semiconductor chip is sealed by a resin. After that, the circuit board is removed from the push-back circuit board frame. The push-back circuit board frame is effective for highly integrated semiconductor device because it is easy to remove the circuit board from the frame without stressing the semiconductor device.

On the other hand, as the circuit board is supported by the frame with a frictional force only, it is easy for the circuit board to come off from the frame during an assembly process that includes a chip mounting process, a wiring process, and a molding process.

SUMMARY OF THE INVENTION

An objective of the invention is to resolve the above-described problem and to provide a push-back circuit board frame having a circuit board which is firmly supported by the frame during the assembling process.

The objective is achieved by a push-back circuit board frame on which a semiconductor device is mounted, including a circuit board, the board being detached from the frame and being returned to an original position in the frame, a cavity formed at an edge of the circuit board in the frame, a semiconductor chip mounted on the circuit board, a resin sealing the semiconductor chip on the circuit board, and a support base made of the same material as the resin, formed in the cavity, where all of the resin is formed simultaneously, and connected each other.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
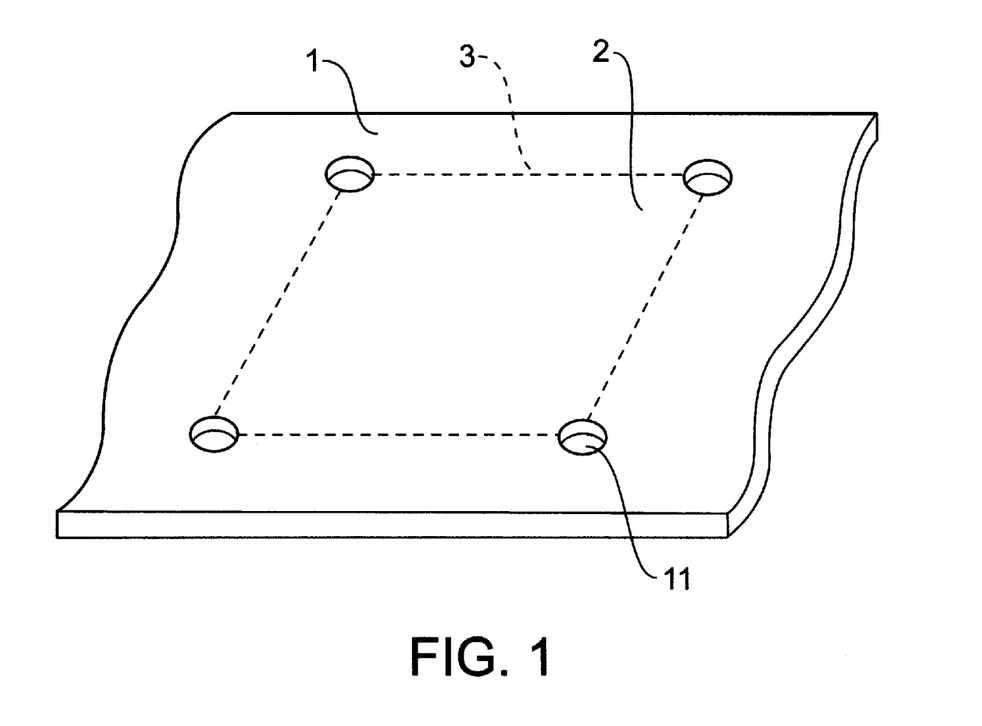
FIG. 1 is a prospective view of a push-back circuit board frame of a first embodiment of the invention.

Referring to FIG. 1, a push-back circuit board frame 1 has a rectangularly-shaped circuit board 2 and a cavity 11 at each of the four corners of the circuit board 2. The circuit board 2 is defined in the circuit board frame 1 by a push-back line 3. Circuit patterns are formed on the circuit board 2.

Figure 2A:
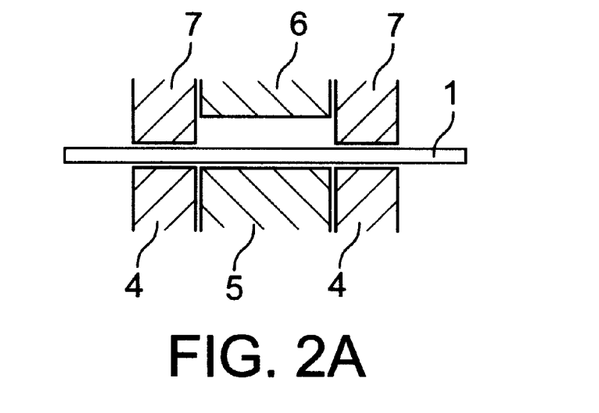
FIGS. 2A–2C show a process to form a push-back circuit board frame
Figure 2B:
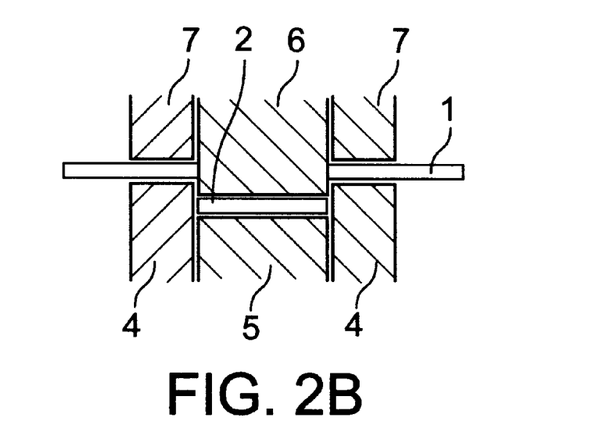
Figure 2C:
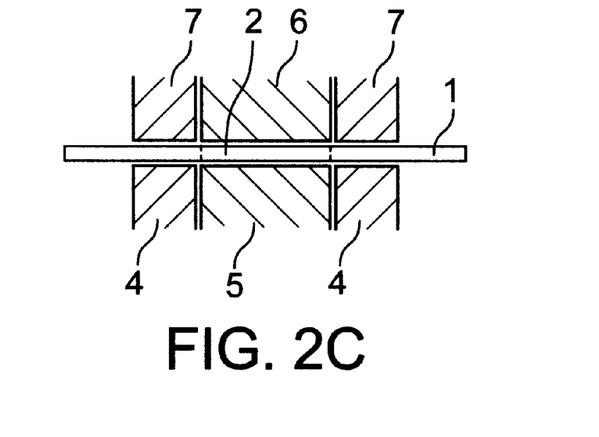

The push-back circuit board frame 1 is formed by the following process shown in FIG. 2A through FIG. 2C. First, the four cavities 11 are formed in the frame 1 at the corners of the circuit board 2. Then the frame 1 is fixed between a die 4 and a punch guide 7. Then, the circuit board 2 is cut along the push-back line 3 by sliding a push-back punches 5, 6 down. After that, the circuit board 2 is returned to the original position in the circuit board frame 1 by sliding the punches 5, 6 upward.

Figure 3A:
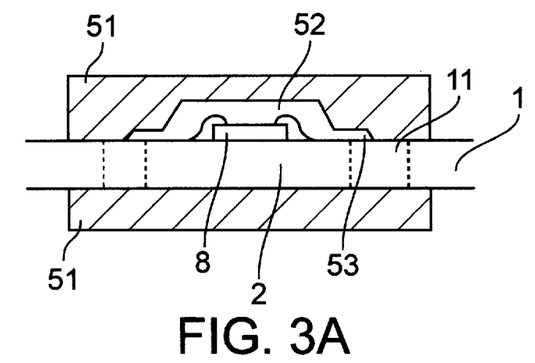
FIG. 3A is a sectional view showing a process to manufacture a semiconductor device with a frame of a first embodiment using a first mold.
Figure 3B:
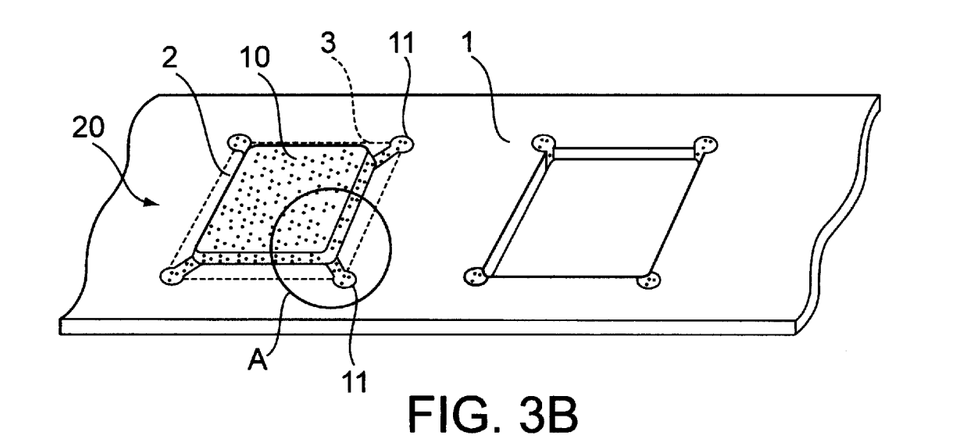
FIG. 3B is a prospective view of a push-back circuit board frame on which a molded semiconductor chip is mounted, of a first embodiment of the invention.
Figure 5:
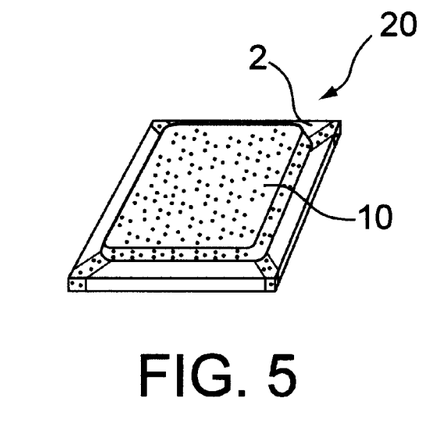
FIG. 5 is a prospective view of a semiconductor device which is manufactured by using the push-back circuit board frame.

Referring to FIGS. 3A and 3B, to form a semiconductor device 20, first, a semiconductor chip 8 is mounted on the frame 1, which is formed by the process described above. Then, the frame 1 is placed in a first mold 51. The mold 51 has an unillustrated cavity in which a resin tablet is placed, an unillustrated first runner which acts as a pass between the cavity of the mold 51 and a room 52 where the semiconductor chip 8 is located, and an second runner 53 which acts as a pass between the cavity 11 of the frame 1 and the room 52. The resin tablet is melted, then, the melted resin flows through the first runner to the room 52. The melted resin also flows through the second runner 53 into the cavity 11. After the melted resin becomes a solid 10, the semiconductor device 20 is detached from the frame 1 along the push-back line 3. The detached semiconductor device is shown in FIG.

Figure 6:
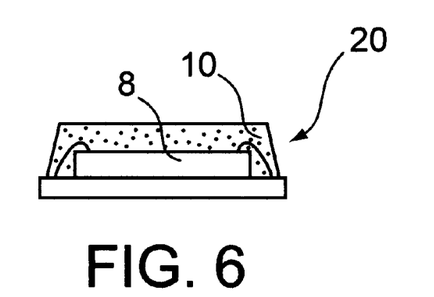
FIG. 6 is a sectional view of the semiconductor device shown in FIG. 5.

5, and a sectional view of the detached semiconductor device 20 is shown in FIG. 6.

Figure 4:
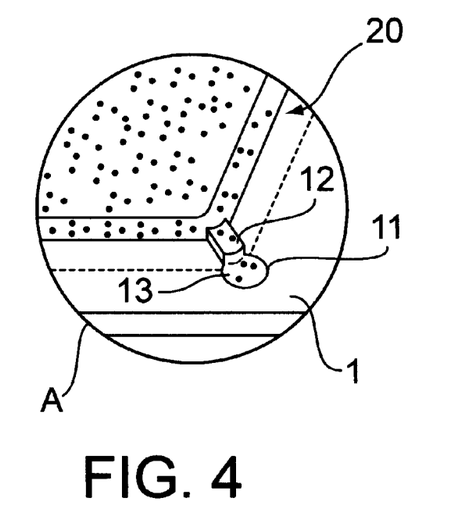
FIG. 4 is an enlarged view of an area A shown in FIG. 3, of the first embodiment of the invention.

Referring to FIG. 4, the semiconductor device 20, which is not detached from the frame 1 yet, is illustrated as an enlarged drawing of an area A in FIG. 3. As the mold has the second runners and the frame 1 has four cavities 11, a support member 12 of the solid resin 10 is formed where the second runners are located, and a support base 13 is formed in each of the cavities 11 of the frame 1. Therefore, the semiconductor device 20 is supported by the frame 1 with the four support members 12 and the support bases 13.

According to the first embodiment of the invention, as the circuit board 2 is supported by the frame 1 with the support members 12 and the support base 13 in addition to a frictional force, the semiconductor device 20 is not easily detached from the frame during the assembling process, after the molding process.

Figure 3C:
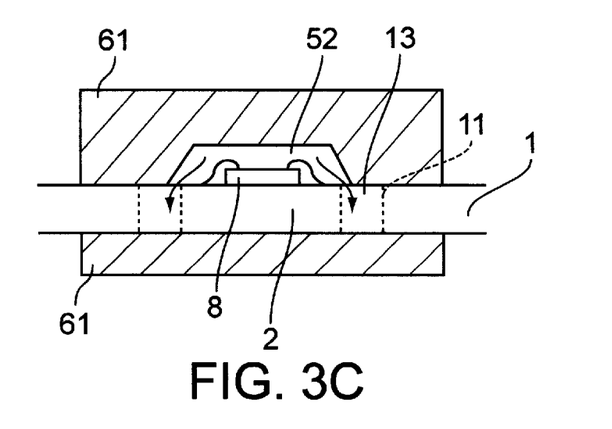
FIG. 3C is a sectional view showing a process to manufacture a semiconductor device with a frame of a first embodiment using a second mold.

Referring to FIG. 3C, a second mold 61 as the alternative is used. A difference between the first mold 51 shown in FIG. 3A and the second mold 61 is that the second mold has no second runner which flows the melted resin to the cavity 11. Therefore, when the frame 1 is placed in the second mold 61, a room 52 of the second mold 61 is directly connected to the cavities 11 of the frame 1. So, the melted resin, which is introduced in the room 52, flows to the cavities 11 of the frame 1. The melted resin in the cavities 11 of the frame 1 becomes a sold to be a support base 13. In the case that the second mold 61 is used, although the circuit board 2 is supported by the frame 1 with the support base 13 only in addition to a frictional force, it is enough to support the circuit board 2 with it. The shape of the second mold 61 is simpler than that of the first mold 51.

Figure 7:
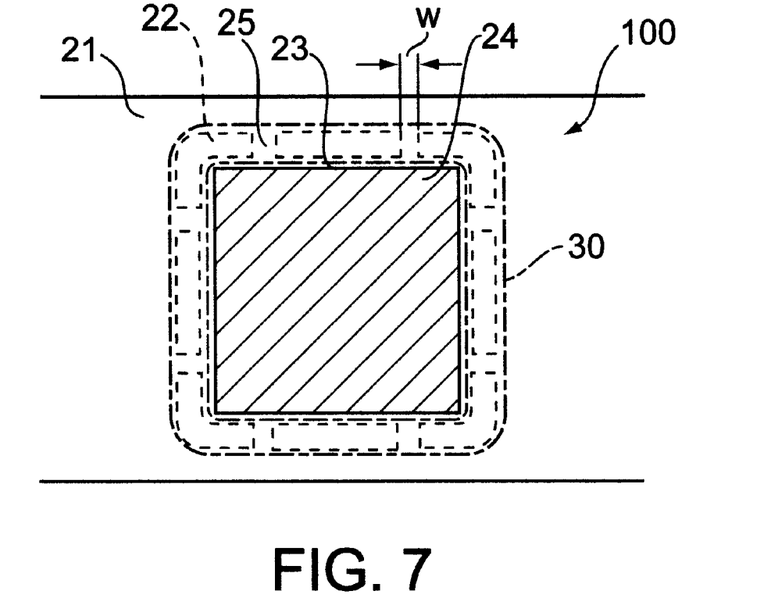
FIG. 7 is a plan view of a push-back circuit board frame of a second embodiment of the invention.
Figure 8:
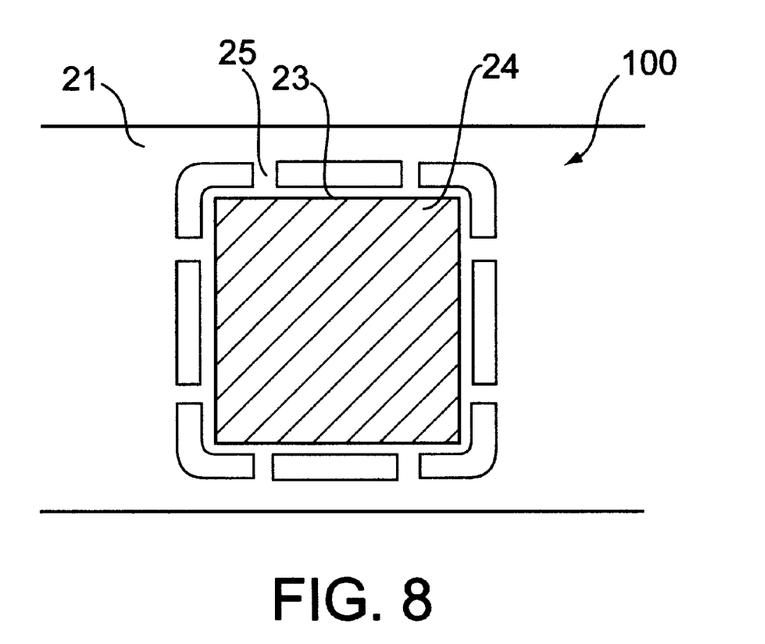
FIG. 8 is a plan view of a push-back circuit board frame of the second embodiment of the invention after removing a circuit board frame material from a push-back area.

A second embodiment of the invention is explained with reference to FIG. 7 through FIG. 11. A push-back circuit board frame 21 includes a plurality of push-back members 22 and a circuit board 23. The push-back members 22 are formed in a push back area 30 where is at circumferentical location of the circuit board 23, specifically, at each corner of the circuit board 23. The push-back members 22 are isolated from each other by supporting members 25 which is a part of the circuit board frame 21. The width W of the supporting member 25 equals to 1 to 3 times the thickness of the circuit board frame 21. The push-back process for forming the push-back member 22 is performed by the method which is described above with respect to the first embodiment. That is, the frame 21 is fixed by a die and the punch guide, and then the push-back punches are placed on areas where the push-back members 22 are formed. After that, by sliding the punches down, the push-back members 22 are detached from the frame 21, and then, by sliding the punches upward, the push-back members 22 are returned to the original positions. After the push-back process is performed, a semiconductor chip is mounted on the circuit board 23, and then a wire bonding process and a molding process are performed. FIG. 7 illustrates a semiconductor device 100 which is molded by a resin 24. In this condition, the semiconductor device is still on the circuit board frame 21. After that, referring to FIG. 8, the push-back members 22 are removed. The semiconductor device 100 is still supported only by the support members 25.

Figure 9:
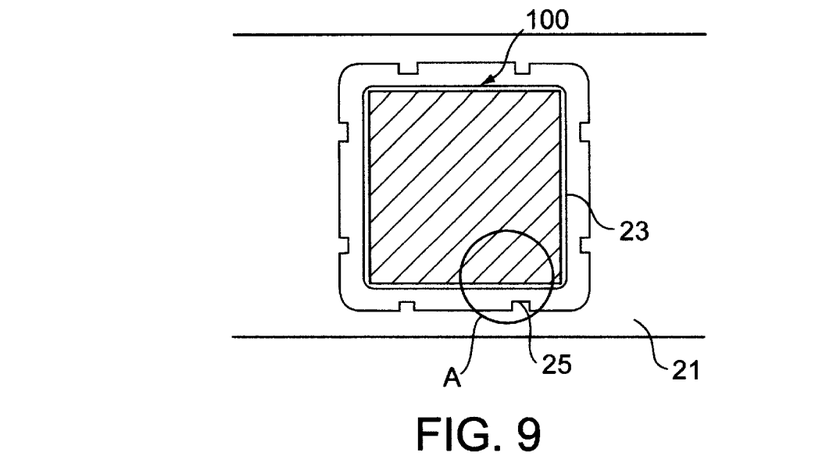
FIG. 9 is plan view of a push-back circuit board frame of the second embodiment of the invention after a semiconductor device is removed from the frame.
Figure 10:
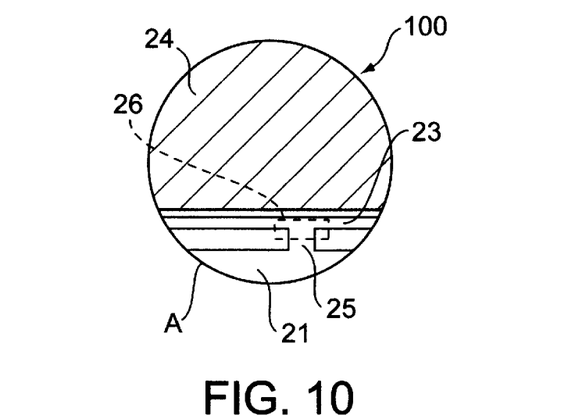
FIG. 10 is an enlarged view of an area A shown in FIG. 9 before the semiconductor device is removed from the push-back circuit board frame.
Figure 11:
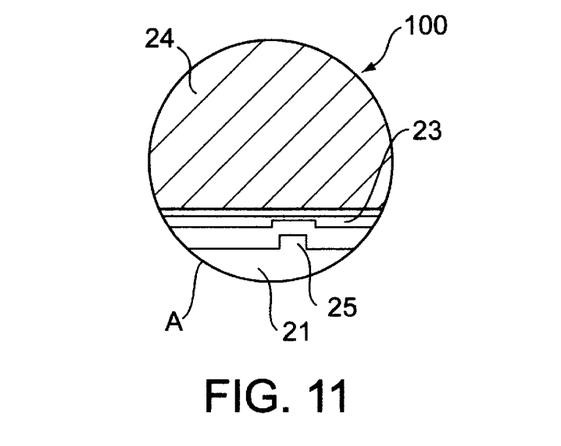
FIG. 11 is an enlarged view of an area A shown in FIG. 9 after the semiconductor device is removed from the push-back circuit board frame.

Referring to FIG. 9, the support members 25 are cut, and then the semiconductor device 100 is completely detached from the circuit board frame 21. This detaching process is explained with reference to FIG. 10 and FIG. 11. The circuit board frame 21 is fixed between a die and a punch guide. Then, a push-back punch and a punch are aligned in an area which is shown by a broken line 26 and then, the push-back punch and the punch are moved down to cut the support member 25 along the broken line. As a result, the semiconductor device is completely detached from the circuit board frame 21, as shown in FIG. 11.

According to the second embodiment of the invention, as the circuit board 23 is supported by the frame 21 with the support members 25 during the mounting process of the semiconductor chip, the wire bonding process and the molding process, the semiconductor device 20 is not detached from the frame 21 through the assembly process.

While the invention has been described with reference to illustrative embodiments, this description is not intended to be construed in a limiting sense. For example, although the cavities 11 are formed at a corner of the circuit board in the first embodiment, the cavities can be formed at any sides of the circuit board. Further, although the rectangularly shaped circuit board is illustrated in the first and the second embodiments respectively, circular shaped circuit board can be used in the both of the embodiments. Various modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A push-back circuit board frame on which a semiconductor device is mounted, comprising:
   a circuit board frame having a frame member and a circuit board, which is encompassed by the frame member, the circuit board in an original position being detached from the frame member and being returned to the original position;
   a cavity formed in the circuit board frame in an area covering the frame member and the circuit board;
   a semiconductor chip mounted on the circuit board; a resin sealing the circuit board on which the semiconductor chip is mounted; and
   a support base made of the same material as the resin, formed in the cavity;
   wherein the resin on the circuit board and the support base are formed simultaneously and connected to each other, and wherein the circuit board is fixed to the frame member by the support base.

2. A push-back circuit board frame as claimed in claim 1, wherein the circuit board is formed in rectangularly-shape.

3. A push-back circuit board frame as claimed in claim 2, wherein the cavity is formed at each corner of the circuit board, wherein the support base is formed in each cavity, and wherein the support member connects the resin on the circuit board and each support base in each cavity.

4. A push-back circuit board frame as claimed in claim 1, further comprising:
   a support member made of the same material as the resin, formed between the resin on the circuit board and the support base, the support member connecting the resin on the circuit board to the support base,
   wherein the resin on the circuit board, the support member and the support base are formed simultaneously, and wherein the circuit board is further fixed to the frame member by the support member.

5. A push-back circuit board frame on which a semiconductor device is mounted, comprising:
   a circuit board frame having a first area, a second area and third area, the first area being encompassed by the second area and the second area being encompassed by the third area;

a circuit board formed in the first area;

a plurality of push-back members formed in the second area;

a plurality of support members located between the push-back members, the support members fixing the circuit board to the frame member;

a semiconductor chip mounted on the circuit board; and a resin sealing the circuit board on which the semiconductor chip is mounted, wherein the support members and the bush-back members are exposed from the resin.

6. A push-back circuit board frame as claimed in claim 5, wherein the push-back members are formed at each corner of the circuit board.

7. A push-back circuit board frame as claimed in claim 5, wherein the plurality of support members includes eight support members supporting the circuit board.

8. A push-back circuit board frame, comprising:

a circuit board frame having a frame member and a circuit board, which is encompassed by the frame member, the circuit board in an original position being detached from the frame member and being returned to the original position, and a cavity formed in the circuit board frame in an area covering the frame member and the circuit board.

9. A push-back circuit board frame as claimed in claim 8, wherein the circuit board is formed in rectangularly-shape.

10. A push-back circuit board frame as claimed in claim 9, wherein the cavity is formed at each corner of the circuit board.

11. A push-back circuit board frame, comprising:

a circuit board frame having a first area, a second area and third area, the first area being encompassed by the second area and the second area being encompassed by the third area;

a circuit board formed in the first area, the circuit board being provided in order to mount a semiconductor chip and to be covered by a resin;

a plurality of push-back members formed in the second;

a frame member formed in the third area; and a plurality of support members located between the push-back members, the support members fixing the circuit board to the frame member.

12. A push-back circuit board frame as claimed in claim 11, wherein the circuit board is formed in rectangularly-shape.

13. A method for forming a semiconductor device, comprising:

preparing a circuit board frame which has a frame member and a circuit board, which is encompassed by the frame member;

forming a cavity in the circuit board frame in an area covering the frame member and the circuit board;

detaching the circuit board being in an original position from the frame member, and returning the circuit board to the original position;

mounting a semiconductor chip on the circuit board;

preparing a mold having a room where the semiconductor chip is placed;

placing the circuit board frame having the cavity in the mold, such that the circuit board is located in the room and the room is connected to the cavity;

introducing a melted resin in the room of the mold, and then, introducing the melted resin in the cavity;

solidifying the melted resin both in the room and in the cavity, whereby the circuit board is fixed to the frame member by the solidified resin in the cavity; and detaching the circuit board from the frame member.

14. A method for forming a semiconductor device as claimed in claim 13, wherein the circuit board is formed in rectangularly-shape.

15. A method for forming a semiconductor device as claimed in claim 14, wherein the cavity is formed at each corner of the circuit board.

16. A method for forming a semiconductor device, comprising:

preparing a circuit board frame which has a frame member and a circuit board, which is encompassed by the frame member;

forming a cavity in the circuit board frame in an area covering the frame member and the circuit board;

detaching the circuit board in an original position from the frame member, and returning the circuit board to the original position;

mounting a semiconductor chip on the circuit board;

preparing a mold having a runner and a room where the semiconductor chip is placed;

placing the circuit board frame having the cavity in the mold, such that the circuit board is located in the room;

introducing a melted resin in the room of the mold, and then, introducing the melted resin in the cavity via the runner;

solidifying the melted resin in the room, in the cavity and in the runner, whereby the solidified resin in the mold is connected to the solidified resin in the cavity by the solidified resin in the runner, and the circuit board is fixed to the frame member by the solidified resin in the cavity; and detaching the circuit board from the frame member.

17. A method for forming a semiconductor device as claimed in claim 16, wherein the circuit board is formed in rectangularly-shape.

18. A method for forming a semiconductor device as claimed in claim 17, wherein the cavity is formed at each corner of the circuit board.

19. A method for forming a semiconductor device, comprising:

preparing a circuit board frame having a first area, a second area and third area, the first area being encompassed by the second area and the second area being encompassed by the third area, the circuit board frame having a frame member in the third area and a circuit board in the first area;

forming a plurality of push-back members in the second area and a plurality of support members in the second area by detaching parts of the circuit board frame from an original position and returning the parts to the original position, such that the push-back members are isolated from each other by the support members;

mounting a semiconductor chip on the circuit board, and sealing the circuit board on which the semiconductor chip is mounted by a resin, wherein the support member and the bush-back members are exposed from the resin;

removing the push-back members from the frame; and cutting the support members.

20. A method for forming a semiconductor device as claimed in claim 19, wherein the circuit board is formed in rectangularly-shape.

21. A method for forming a push-back circuit board frame, comprising:
- preparing a circuit board frame having a frame member and a circuit board, which is encompassed by the frame member;
- detaching the circuit board being in an original position from the frame member;
- returning the circuit board to the original position; and
- forming a cavity in the circuit board frame in an area covering the frame member and the circuit board.

22. A method for forming a semiconductor device as claimed in claim 21, wherein the circuit board is formed in rectangularly-shape.

23. A method for forming a semiconductor device as claimed in claim 22, wherein the cavity is formed at each corner of the circuit board.

24. A method for forming a push-back circuit board frame, comprising:
- preparing a circuit board frame having a first area, a second area and third area, the first area being encompassed by the second area and the second area being encompassed by the third area, the circuit board frame having a frame member in the third area and a circuit board in the first area, and the circuit board being provided in order to mount a semiconductor chip and to be covered by a resin; and
- forming a plurality of push-back members in the second area and a plurality of support members in the second area by detaching parts of the circuit board frame from an original position and returning the parts to the original position, the push-back members being isolated from each other by the support members.

25. A method for forming a semiconductor device as claimed in claim 24, wherein the circuit board is formed in rectangularly-shape.

26. A method for forming a push-back circuit board frame as claimed in claim 25, wherein the push-back members are formed at each corner of the circuit board.

* * * * *